(12) United States Patent
Yang et al.

(10) Patent No.: US 9,934,845 B2
(45) Date of Patent: Apr. 3, 2018

(54) LATCH WITH BUILT-IN LEVEL SHIFTER

(71) Applicant: Taiwan Semiconductor Manufacturing Company Limited, Hsinchu (TW)

(72) Inventors: Hao-I Yang, Taipei (TW); Cheng Hung Lee, Hsinchu (TW); Chi-Kai Hsieh, Taoyuan (TW); Fu-An Wu, Hsinchu (TW); Tsung-Hsien Huang, Hsinchu (TW)

(73) Assignee: Taiwan Semiconductor Manufacturing Campany Limited, Hsinchu (TW)

( * ) Notice: Subject to any disclaimer, the term of this patent is extended or adjusted under 35 U.S.C. 154(b) by 0 days.

(21) Appl. No.: 15/405,423

(22) Filed: Jan. 13, 2017

(65) Prior Publication Data

US 2017/0345487 A1    Nov. 30, 2017

Related U.S. Application Data

(60) Provisional application No. 62/341,181, filed on May 25, 2016.

(51) Int. Cl.
| G11C 7/10 | (2006.01) |
| G11C 11/419 | (2006.01) |
| H03K 3/356 | (2006.01) |
| H03K 19/0175 | (2006.01) |

(52) U.S. Cl.
CPC .............. G11C 11/419 (2013.01); G11C 7/10 (2013.01); H03K 3/356113 (2013.01); H03K 19/0175 (2013.01)

(58) Field of Classification Search
CPC ....................................................... G11C 7/10
USPC .................................................... 365/189.11
See application file for complete search history.

(56) References Cited

U.S. PATENT DOCUMENTS

| 8,378,728 B1 * | 2/2013 | Goyal | ................ | H03K 3/35625 326/80 |
| 2014/0254293 A1 * | 9/2014 | Desai | ................... | G11C 7/1096 365/189.16 |

* cited by examiner

*Primary Examiner* — Hoai V Ho
*Assistant Examiner* — Jay Radke
(74) *Attorney, Agent, or Firm* — Jones Day

(57) ABSTRACT

A semiconductor device comprising a first supply voltage, a second supply voltage, different from the first supply voltage; and a switching circuit. The switching circuit comprises an input configured to receive an input signal corresponding to the first supply voltage and an output configured to output an output signal corresponding to the second supply voltage. The switching circuit is a combined latch with a built-in level shifter that provides latching functionality and level shifting functionality and a leakage path is cut-off when the switching circuit is providing latching functionality.

20 Claims, 5 Drawing Sheets

LATCH WITH BUILT-IN LEVEL SHIFTER

CROSS-REFERENCE TO RELATED APPLICATIONS

This application claims priority to U.S. Provisional Patent Application No. 62/341,181, filed May 25, 2016, entitled "Dual-Rail SRAM Latch with Built-In Level Shifter," which is incorporated herein by reference in its entirety.

TECHNICAL FIELD

This relates to semiconductor devices and more particularly to semiconductor devices comprising latches with a built-in level shifter.

BACKGROUND

Latches and level shifters may be used in a variety of semiconductor devices including memory devices such as static random access memory (SRAM) devices. An SRAM is a semiconductor memory device that stores bits of data. SRAM devices generally have two main portions—the memory cells for storing bits of data and the control circuitry for operating/controlling the SRAM device. The control circuitry may include one or more latches and/or level shifters.

SRAM devices may be built using complementary metal-oxide semiconductor (CMOS) technology. In SRAM devices utilizing CMOS technology, increasing the supply voltage with level shifting circuitry generally increases the speed and reliability of the memory cells within the SRAM device but also causes an increase in leakage from other components within the SRAM control circuitry. A dual-rail SRAM device utilizes two power rails to address this issue. In a dual-rail SRAM, a first, lower voltage is provided to operate certain portions of the SRAM control circuitry and a second, generally higher, voltage is utilized for the memory cells and corresponding drivers. To step from the first voltage to the second voltage, a level shifter is utilized within the SRAM to shift the voltage level from the lower voltage of the control circuitry to the higher voltage of the memory cells.

In addition to the level shifter, separate latches are also incorporated into SRAM devices as part of the control circuitry of the SRAM device to write data into the corresponding memory cell. The inclusion of separate level shifters and latches into an SRAM device causes the SRAM device to occupy substantial area and introduces gate delay latency as a result of the control signal setup time, in addition to the typical leakage penalty noted above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
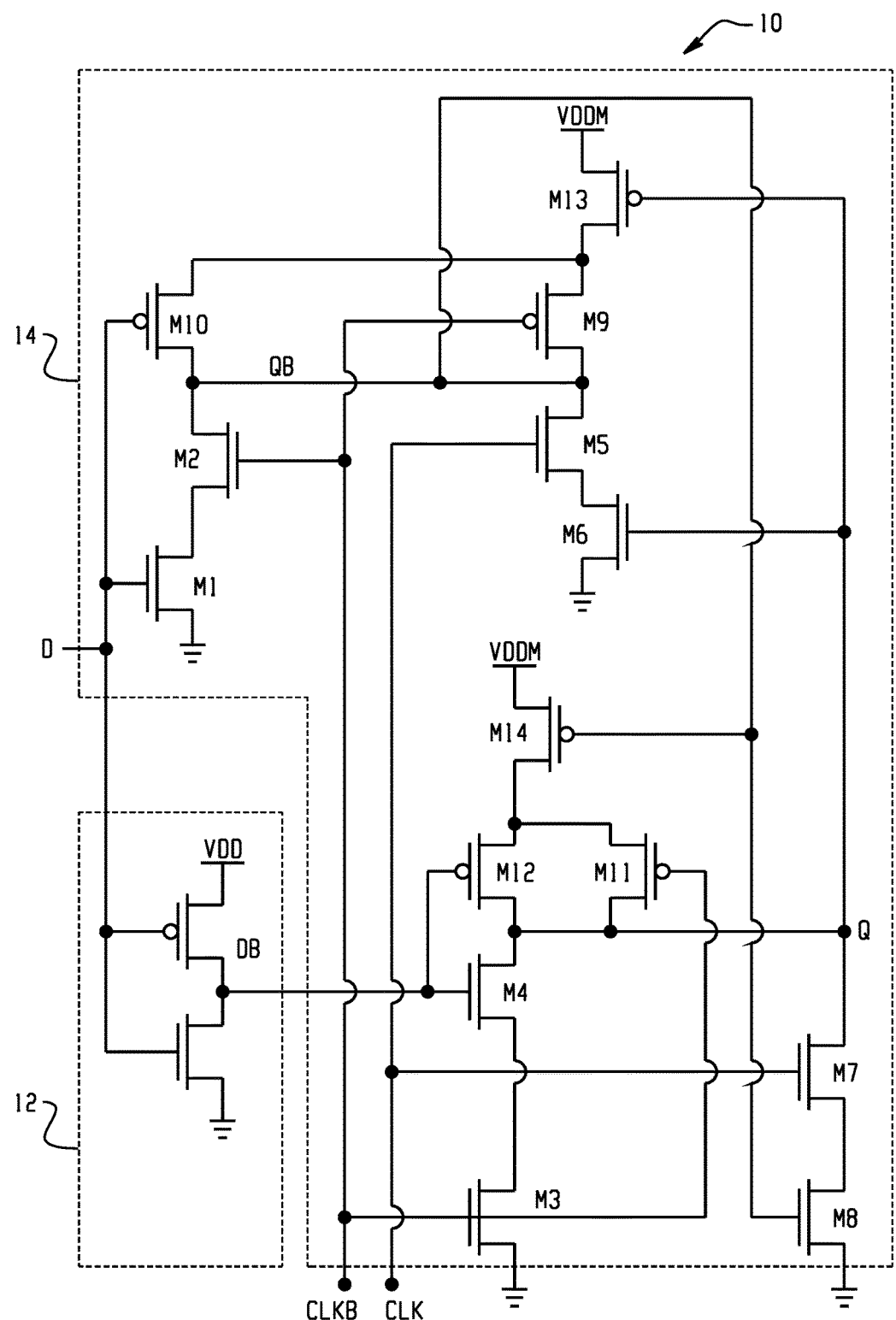
FIG. 1 is a schematic drawing of a first example of a combined latch/level shifter switching circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure, in various embodiments, provides novel systems and methods for a semiconductor device such as SRAM control circuitry and more specifically may provide for novel constructions for a dual-rail SRAM latch with a built-in level shifter that may address one or more of the disadvantages of existing dual-rail SRAM devices. Additionally, although embodiments of the semiconductor devices described herein are implemented using CMOS devices, other types of transistors may also be used (e.g., N type metal oxide MOS devices, P type metal oxide MOS devices, bipolar junction transistors (BJTs), field effect transistors (FETs), junction field effect transistors (JFETs), etc.).

FIG. 1 is a schematic drawing of a first example of a combined latch/level shifter switching circuit. In certain embodiments, the combined latch/level shifter switching circuit 10 may be incorporated into an SRAM device in a portion of the memory device upstream from the memory cell so the combined latch/level shifter switching circuit can latch data bits into a corresponding memory cell of the SRAM. The switching circuit 10 may be described as a latch with a built in level shifter because, in certain embodiments, the switching circuit may perform both a latching operation and a level shifting operation, depending on its mode of operation. The switching circuit 10 illustrated in FIG. 1 has two modes of operation or phases—a transparent phase and a latch phase. In the transparent phase, the switching circuit of FIG. 1 provides an output at node Q that is proportional to the input received at data input node D. Specifically, a signal that is received at input node D in the VDD domain is shifted to the VDDM domain for output at output node Q (e.g., a VDD signal at input node D is shifted to VDDM at output node Q and a 0 signal at input node D is presented at output node Q as a 0 signal). In the latch phase, the switching circuit 10 is configured to hold data present at the output node Q in the VDDM domain for a period of time (e.g., one or more clock cycles).

The switching circuit 10 of FIG. 1 can be implemented in a variety of ways. As illustrated in FIG. 1, portions of the switching circuit 10 operate at a first supply voltage VDD and other portions of the switching circuit 10 operate at a second supply voltage VDDM (corresponding to the voltage utilized for the memory cells). Generally, it may be desirable for VDDM to be higher than VDD, but in some embodiments, VDDM may be lower than VDD. In the example illustrated in FIG. 1, the inverter circuit 12 operates in the VDD domain and the remaining portion 14 of the switching circuit 10 operates in the VDDM domain. As would be understood by a person of skill in the art, a particular device may operate in a particular voltage domain because of the voltage level being applied to the particular device. As illustrated in FIG. 1, a voltage VDD or VDDM is applied to the source/drain of the individual CMOS devices.

Clock inputs CLK and CLKB operate to change the phase of the switching circuit. CLKB is a logical compliment of CLK. A detailed description of the function of the combined latch/level shifter switching circuit in the transparent phase is described below with reference to FIG. 2, and function of the combined latch/level shifter switching circuit in the latch phase is described in detail with reference to FIG. 3.

Figure 2:
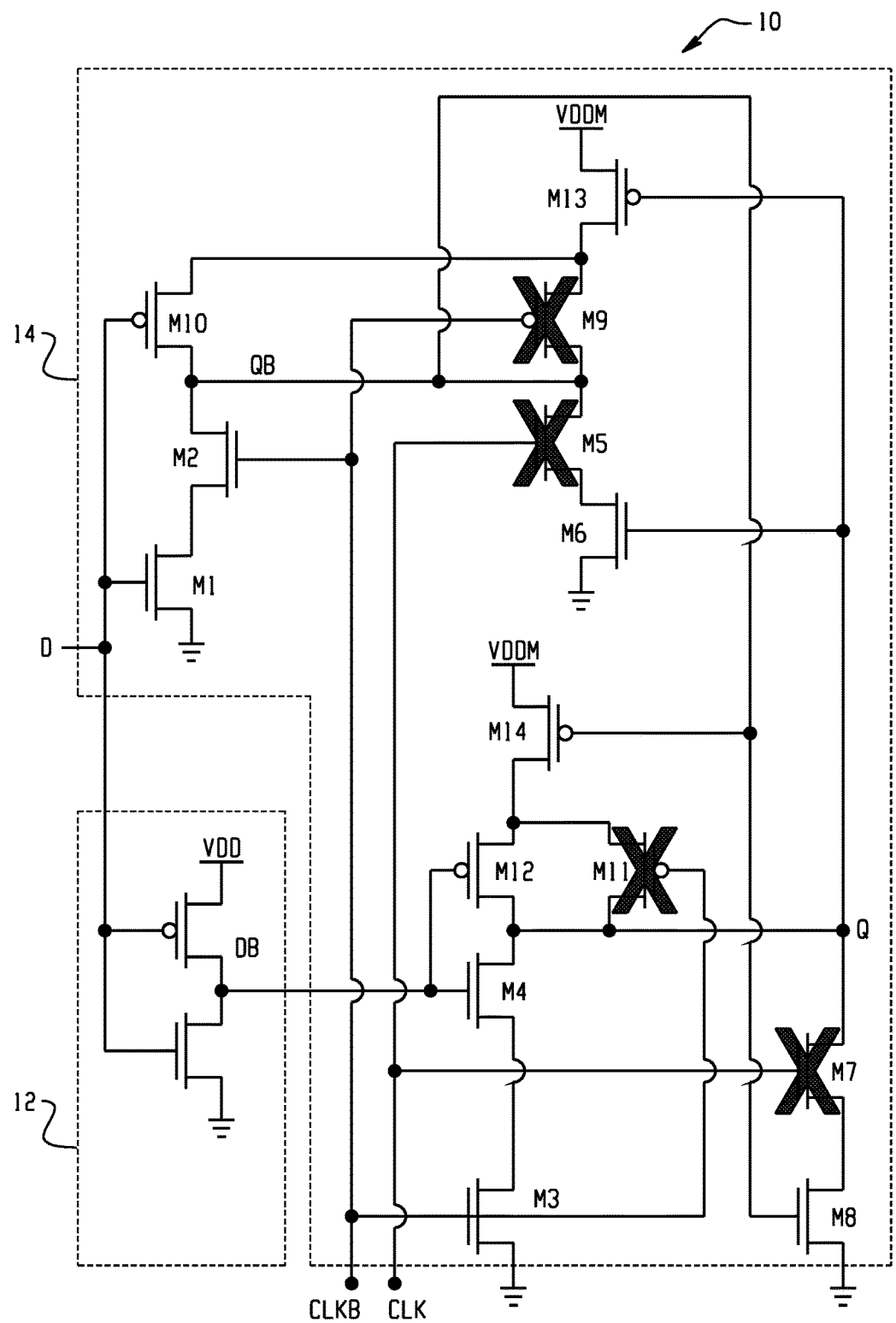
FIG. 2 is a schematic drawing of the first example of the combined latch/level shifter switching circuit in operation during a transparent phase, in accordance with some embodiments.

FIG. 2 is a schematic drawing of the first example of the combined latch/level shifter switching circuit 10 in operation during a transparent phase. The switching circuit 10 in FIG. 2 is the same as that illustrated in FIG. 1 except certain CMOS transistors have been shown with an "X" to indicate they are in an OFF state during the transparent phase. The transparent phase is triggered while CLK=0 and CLKB=1. In this situation, NMOS devices M5 and M7 both receive the CLK=0 gate voltage and are therefore OFF. PMOS devices M9 and M11 both receive the CLKB=1 gate voltage and are therefore OFF. Accordingly, during the transparent phase, MOS devices M5, M7, M9, and M11 are OFF (i.e., open switches) irrespective of the value of input D. In contrast, NMOS devices M2 and M3 both receive the CLKB=1 gate voltage and are therefore ON (i.e., closed switches) irrespective of the value of input D. In this manner, MOS devices M1, M2, M3, M4, M10, M12, M13, and M14 (operating in the VDDM voltage domain) along with the inverter 12 operating in the VDD voltage domain, form a level shifter to shift the voltage of the data signal at D from the VDD domain to VDDM domain at the output Q. The shift from one voltage domain to another changes the voltage of the logical high value from VDD to VDDM but the voltage of the logical low value remains the same—0 Volts.

In more detail, the level shifting operation illustrated in FIG. 2 functions in the following manner. If D=VDD, M1 turns ON and M10 turns OFF. The output of inverter 12 is 0. Since the output of inverter 12 is 0, M4 is OFF and M12 is ON. Since M1 and M2 are both ON, the voltage at the gate of M14 is 0 and therefore, M14 is ON. Since M14 and M12 are both on, the Voltage VDDM passes to the output Q. Accordingly, there is a level shift from D=VDD to Q=VDDM.

In the situation where D=0, the output of inverter 12 is 1 which causes M12 to turn OFF and M4 to turn ON. Since CLKB=1, M3 is also ON. As a result, the output Q is connected to the ground via M4 and M3. Therefore, the output Q=0.

Figure 3:
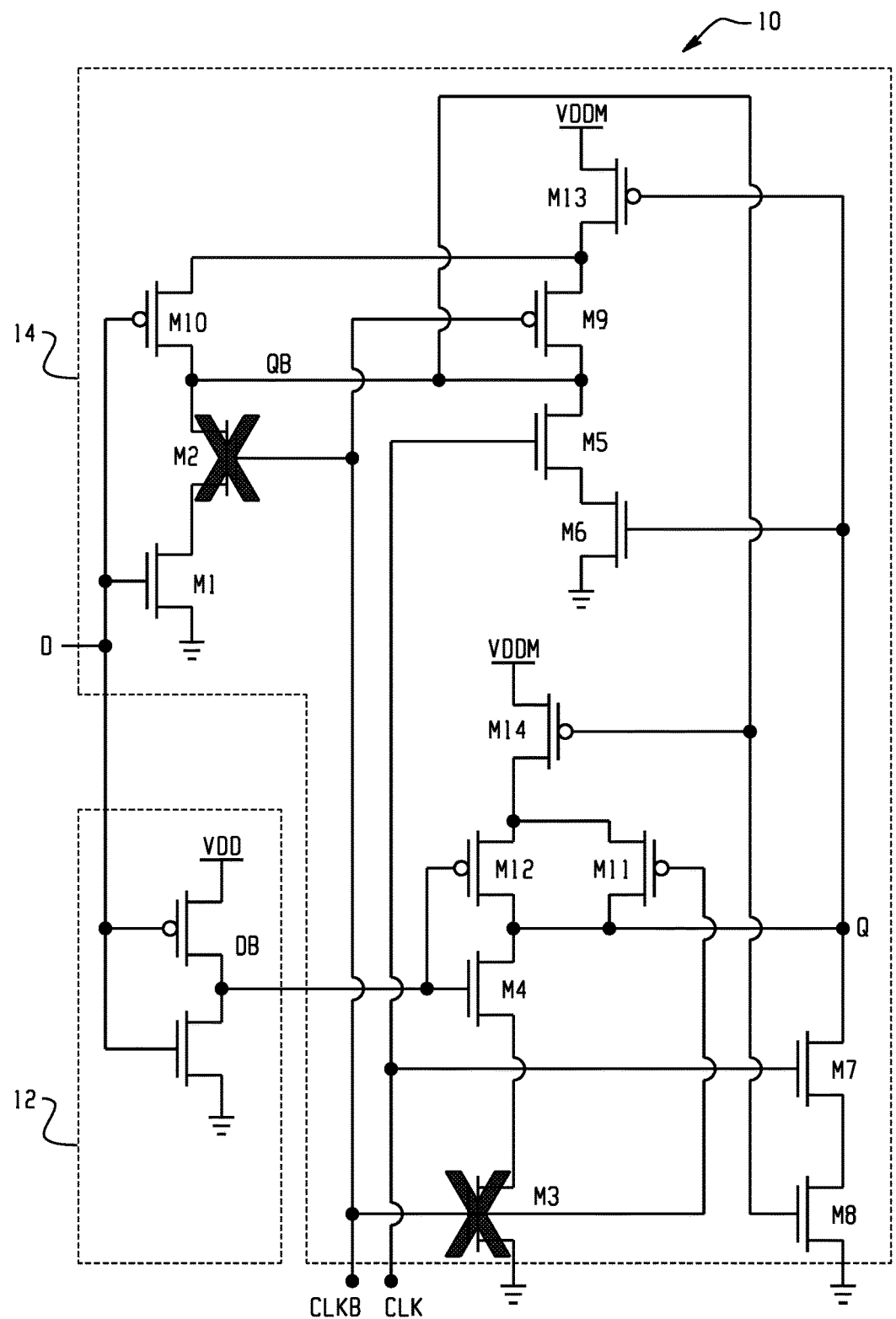
FIG. 3 is a schematic drawing of the first example of the switching circuit in operation during a latch phase, in accordance with some embodiments.

FIG. 3 is a schematic drawing of the first example of the switching circuit 10 in operation in a latch phase. The switching circuit 10 in FIG. 3 is the same as that illustrated in FIG. 1 and FIG. 2 except certain CMOS transistors have been shown with an "X" to indicate they are in an OFF state during the latch phase. The latch phase is triggered while CLK=1 and CLKB=0. In this situation, NMOS devices M2 and M3 are both OFF (i.e., open switches) because they receive the CLKB=0 gate voltage. In contrast, NMOS devices M5 and M7 are both ON (i.e., closed switches) because they receive the CLK=1 gate voltage and PMOS devices M9, and M11 are both ON (i.e., closed switches) because they receive the CLKB=0 gate voltage. In this manner, MOS devices M5, M6, M7, M8, M9, M11, M13, and M14 (operating in the VDDM domain) form a latch to latch/store the data at output Q into the corresponding memory cell.

In more detail, the latching operation holds the value at the output Q irrespective of the value at the input D. Accordingly, If Q=VDDM, M6 turns ON. Since M5, M6, and M9 are all ON, the gate voltage applied to M14 and M8 through the drain of M5 is 0. Therefore, M8 is OFF and M14 turns ON. As a result, the value VDDM remains at the output Q, via M14 and M11. The output Q is isolated from the input D because the operation of M1, M4, M10 and M12 do not alter the operation of the switching circuit 10.

In the situation where Q=0, M13 is turned ON because the voltage applied to the gate of M13 is 0. Further, because CLKB at the gate of M9 is 0, M9 is turned ON. Because both M13 and M9 are ON, the voltage at the drain of M9 or at the gate of M8 is VDDM, and M8 is turned ON. As a result, the output Q is coupled to ground via M7 and M8. Once again, the input D is isolated from the output Q because the operation of M1, M4, M10 and M12 do not alter the operation of the switching circuit 10.

In general, the examples described herein are implemented using CMOS transistors. The CMOS transistors described herein may be understood to operate like a switch. In an ON state the switch is closed and in an OFF state the switch is open. For NMOS transistors, when a voltage exceeding the threshold voltage ($V_{TH}$) of the NMOS transistor is applied to the gate, the NMOS transistor turns ON and current passes between the source and the drain, otherwise, the NMOS transistor is OFF and current is prevented from passing between the source and the drain. In the case of a PMOS transistor, when a voltage exceeding the threshold voltage ($V_{TH}$) of the PMOS transistor is applied to the gate, the PMOS transistor is OFF and current is prevented from passing between the source and the drain, otherwise, the PMOS transistor is ON and current passes between the source and the drain.

As noted above, the $V_{TH}$ of a MOS device is the gate voltage necessary to switch a CMOS device between the ON and OFF state. In some examples, the minimum operating voltage of the circuit (VCCmin) can be improved/lowered by including low $V_{TH}$ NMOS devices (e.g., at M1, M2, M3, and M4) in the switching circuit 10 since the operating voltage is proportional to $V_{TH}$. In some embodiments, VCCmin may also be understood as the minimum voltage required to turn an NMOS transistor ON and a PMOS transistor OFF. Although it is generally desirable to reduce the VCCmin of a circuit so as to reduce its power consumption and increase its speed, in some instances, the minimum VCCmin may be limited as a result of the leakage current. For example, the $V_{TH}$ of certain CMOS devices may be set to a larger voltage to maintain leakage current known to be present in the circuit at an acceptable level, despite the increased power consumption. In other words, assuming a constant power, a designer may increase $V_{TH}$ to reduce the amount of leakage current (Power=Voltage×Current).

As discussed above, circuits comprising a separate latch and level shifter may suffer from a leakage current that is present all of the time. That is, certain transistors may be on in both the latch phase and the transparent phase, thereby causing a continuous current drain. In the switching circuit 10 discussed with respect to FIGS. 1, 2, and 3, leakage current may be substantially or completely eliminated during the latch phase. Referring to FIG. 2, during the transparent phase, different combinations of M1, M2, M3 and M4 may be ON or OFF. As a result, there may be leakage current through M1 and M3 to ground. However, referring to FIG. 3, because NMOS transistors M2 and M3 are OFF when the switching circuit is in a latching phase, the connection to the ground is broken and current does not flow through M1, M2, M3, or M4 regardless of the value of D or Q. Accordingly, the switching circuit 10 does not suffer from a leakage penalty all of the time (e.g., not during the latching phase) and a more favorable VCCmin may be utilized in some embodiments—e.g., the VCCmin may be reduced because it is not necessary to maintain it at a higher level to reduce the amount of leakage current.

In addition to improved leakage current characteristics, the switching circuit illustrated in FIG. 1 may have a reduced D-to-Q latency (input to output latency) of 2 gate delays as compared to the 4 gate delays in traditional circuits comprising a separate level shifter and latch. For example, when viewing the switching circuit 10 in FIG. 1, an input at D may only travel through two MOS devices before getting to the output Q. In the example illustrated in FIG. 1, the signal at D travels through the inverter circuit 12 where the logical compliment (DB) of D is output and then through NMOS transistor M4 and to output Q. In certain embodiments, the reduced latency may contribute to a reduction in the control signal setup time for the write operation of the SRAM device.

In certain embodiments, the switching circuit 10 may be smaller than the combination of a separate level shifter and latch circuit. The switching circuit 10 in FIG. 1 is constructed using 16 MOS transistors. In certain embodiments, the switching circuit 10 may be constructed with 18, 17, 16, 15, or 14 CMOS transistors or may occupy about 10%, 15%, 20% or 25% less area than transistor circuits in which the level shifter and switching device are separate. Circuits comprising a separate level shifter and latch may be constructed using at least 20 MOS transistors. These separate circuits may also have a combined D-to-Q latency of 4 gate delays. Additionally, as discussed in more detail below, circuits comprising a separate level shifter and latch may suffer from a leakage penalty all of the time.

Figure 4:
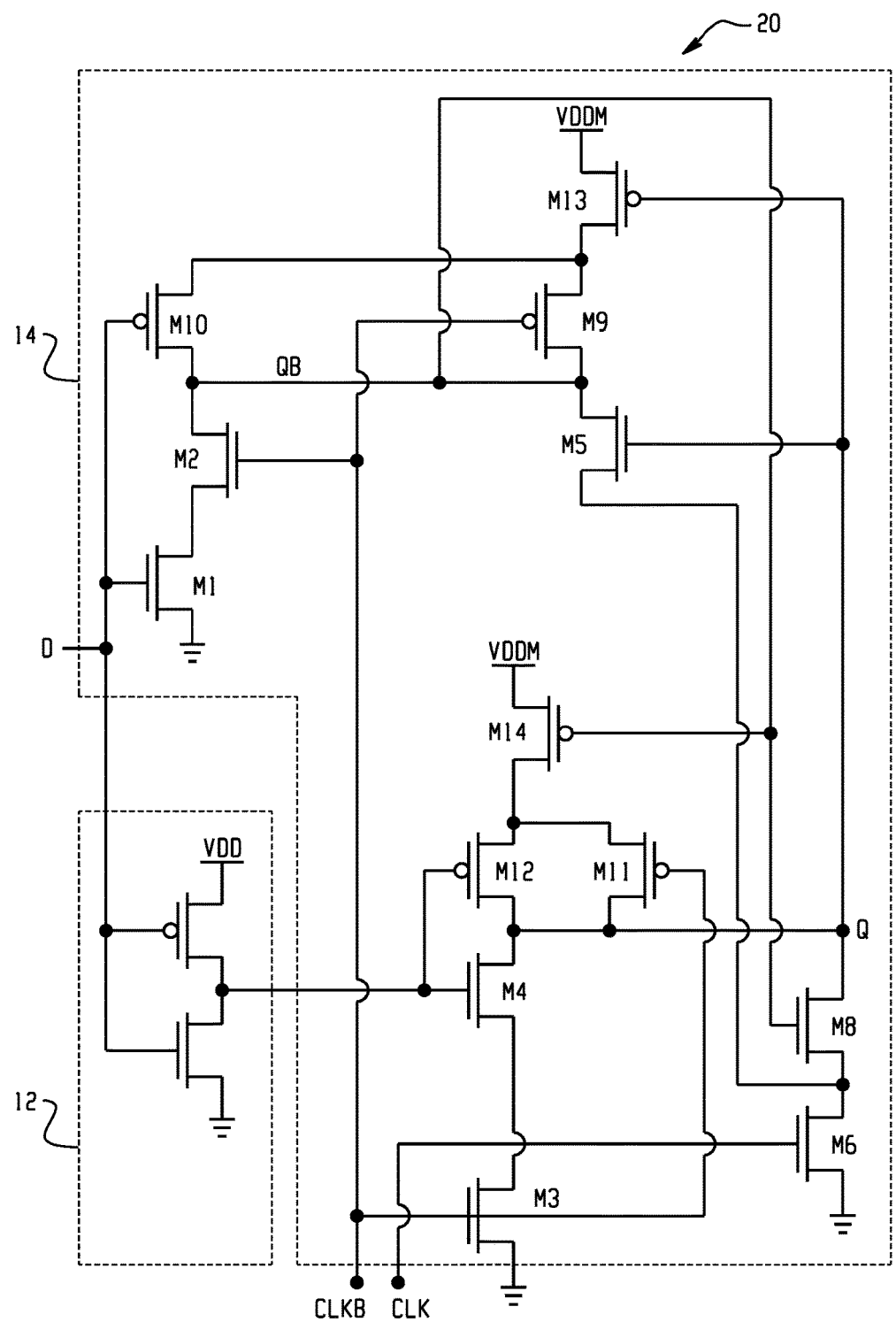
FIG. 4 is a schematic drawing of a second example of a switching circuit, in accordance with some embodiments.

FIG. 4 is a schematic drawing of a second example of switching circuit 20. The operation of the switching circuit 20 in FIG. 4 is similar to the operation of the switching circuit 10 described with respect to FIGS. 1, 2, and 3. However, in FIG. 4, the switching circuit with built-in level shifter is constructed using 15 MOS transistors. The switching circuit 20 differs from switching circuit 10, because CMOS device M7 has been removed and CMOS device M6 has been moved to a location between M8 and ground. Additionally, the gate of M6 has been connected to the CLK input. In operation, the switching circuit 20 operates in a manner similar to the operation of switching circuit 10 described above.

In the transparent phase, M6, M9 and M11 are OFF. When D=VDD, the output of inverter 2 is 0 and M12 is ON. M1 is also ON which causes M8 to be OFF and M14 to turn ON. Accordingly, the output Q=VDDM because M14 and M12 are both ON. When D=0, the output of inverter 12 is 1 and M4 turns on. As a result, the output Q=0 because it is connected to ground through M4 and M3.

In the latch phase, M2 and M3 are OFF. When Q=VDDM, M5 and M14 turn ON which keeps Q=VDDM via M14 and M11. Similarly, when Q=0, M8, M9, and M13 all turn ON and Q is connected to ground via M8 and M6.

Figure 5:
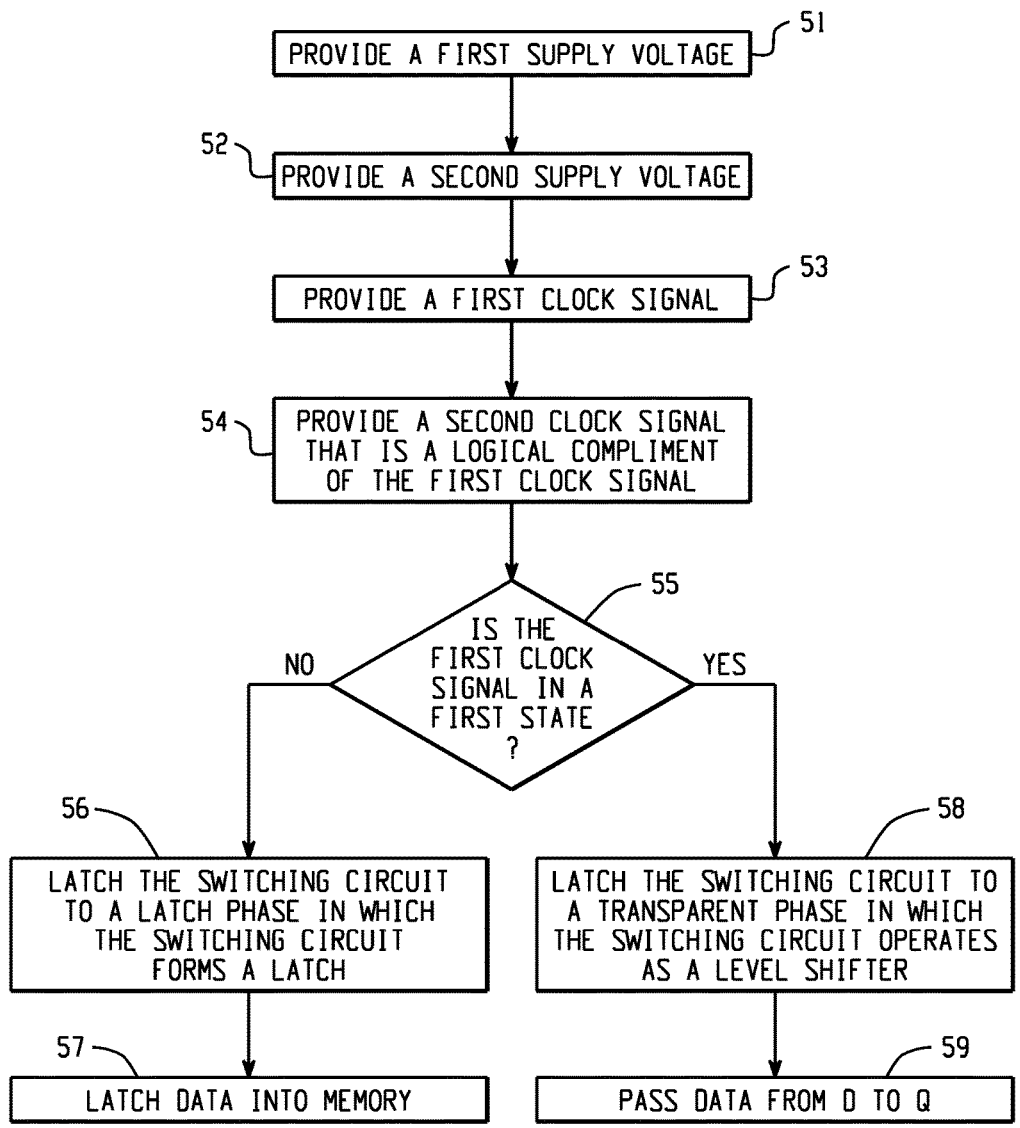
FIG. 5 is a flow chart of a method that may be implemented using the switching circuit described in some embodiments.

FIG. 5 is a flow chart of a method implemented by the switching circuits described herein. The process illustrated in FIG. 5 corresponds to the operation of the switching circuit 10, 20 described with reference to FIGS. 1-4 and is not intended to be limited to any particular order of the steps.

At step 51, the switching circuit 10, 20 is supplied with a first supply voltage VDD. At step 52, the switching circuit 10, 20 is supplied with a second supply voltage VDDM, different from the first supply voltage VDD. The second supply voltage VDDM may be larger than or smaller than the first supply voltage VDD. In step 53, the switching circuit 10, 20 is supplied with a first clock signal CLK and in step 54, the switching circuit 10, 20 is supplied with a second clock signal CLKB. The second clock signal is a logical complement of the first clock signal. The switching circuit 10, 20 is configured to receive the first supply voltage VDD, the second supply voltage VDDM, the first clock signal CLK, and the second clock signal CLKB. In step 55, the switching circuit 10, 20 operates differently depending on the state of the first and second clock signals CLK, CLKB. If the first clock signal CLK is in a first logical state (e.g., a logical 0), the switching circuit 10, 20 latches, in step 58, to a transparent phase (see e.g., FIG. 2) in which the switching circuit operates as a level shifter and passes data from input D to output Q, in step 59. If the first clock signal CLK is in a second logical state (e.g., a logical 1), the switching circuit latches, in step 56, to a latch phase (see e.g., FIG. 3) in which the switching circuit 10, 20 stores the data into the corresponding memory bit at step 57.

The semiconductor devices (e.g., dual-rail SRAM latch with a built-in level shifter) described herein may provide one or more of the following advantages: (1) the latch with built-in level shifter may be implemented with a reduced number of transistors (reduced area) as compared to existing designs; (2) the latch with built-in level shifter may have a reduced setup time (reduced gate delay) as compared to existing designs; and/or (3) the latch with built-in level shifter may benefit from a reduced leakage penalty as compared to existing designs.

Embodiments described herein may provide a semiconductor device comprising a first supply voltage, a second supply voltage, different from the first supply voltage; and a switching circuit. The switching circuit comprises an input configured to receive an input signal corresponding to the first supply voltage and an output configured to output an output signal corresponding to the second supply voltage. The switching circuit is a combined latch with a built-in level shifter that provides latching functionality and level shifting functionality and a leakage path that is present when the switching circuit is providing level shifting functionality and is cut-off when the switching circuit providing latching functionality.

Embodiments described herein may provide a static random access memory (SRAM), comprising a first supply voltage, a second supply voltage, different from the first supply voltage; and a switching circuit. The switching circuit comprises an input configured to receive an input signal corresponding to the first supply voltage and an output configured to output an output signal corresponding to the second supply voltage. The switching circuit is a combined latch with a built-in level shifter that provides latching functionality and level shifting functionality and a leakage path that is present when the switching circuit is providing level shifting functionality and is cut-off when the switching circuit providing latching functionality.

Embodiments described herein may provide a method for latching data in a static random access memory (SRAM) device, the method may comprise providing a first supply voltage, providing a second supply voltage, different from the first supply voltage, providing a first clock signal, and providing a second clock signal, the second clock signal being a logical complement of the first clock signal. The method may further include providing a switching circuit configured to receive the first supply voltage, the second supply voltage, the first clock signal, and the second clock signal. If the first clock signal is in a first logical state, the switching circuit may be latched to a transparent phase in which the switching circuit operates as a level shifter; and if the first clock signal is in a second logical state, the switching circuit may be latches to a latch/write phase in which the switching circuit forms a latch and a leakage path is cut-off.

In certain embodiments, the SRAM may be a dual-rail SRAM. In certain embodiments, the second supply voltage may be larger than the first supply voltage. In certain embodiments, a delay from the input of the switching circuit to the output of the switching circuit may be less than 4 gate delays. In certain embodiments, a delay from the input of the switching circuit to the output of the switching circuit may be about 2 gate delays. In certain embodiments, the switching circuit may be implemented using less than 20 MOS transistors. In certain embodiments, the switching circuit may be implemented using 16 MOS transistors. In certain embodiments, the switching circuit may be implemented using 15 MOS transistors. In certain embodiments, the SRAM may further comprise a first clock signal and a second clock signal that is a logical compliment of the first clock signal for facilitating the latching functionality of the switching circuit. In certain embodiments, the switching circuit may latch between a transparent phase and a latch phase and the leakage path is cut-off when the switching circuit is in the latch phase.

The components and procedures described above provide examples of elements recited in the claims. They also provide examples of how a person of ordinary skill in the art can make and use the claimed invention. They are described here to provide enablement and best mode without imposing limitations that are not recited in the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   a first supply voltage;
   a second supply voltage, different from the first supply voltage; and
   a switching circuit comprising a first portion operating at the first supply voltage and a second portion operating at the second supply voltage;
   an input terminal coupled to the first portion and coupled to the second portion of the switching circuit and configured to receive an input signal corresponding to the first supply voltage and;
   an output configured to output an output signal corresponding to the second supply voltage,
   wherein the switching circuit provides latching functionality and level shifting functionality and a leakage path that is present when the switching circuit is providing level shifting functionality and is cut-off by at least one low threshold voltage transistor in the second portion of the switching circuit when the switching circuit is providing latching functionality.

2. The semiconductor device of claim 1, wherein the semiconductor device is a level shifter.

3. The semiconductor device of claim 2, wherein the level shifter is implemented within a dual-rail SRAM.

4. The semiconductor device of claim 1, wherein the second supply voltage is larger than the first supply voltage.

5. The semiconductor device of claim 1, wherein the first portion of the switching circuit comprises an inverter operating at the first supply voltage.

6. The semiconductor device of claim 1, wherein the switching circuit comprises at least one transistor coupled to a ground and disabled during when the switching circuit is providing latching functionality.

7. The semiconductor device of claim 1, wherein the switching circuit comprises at least one transistor that decouples the input of the switching circuit from the output of the switching circuit during the latch phase so the input of the switching circuit does not alter the output of the switching circuit.

8. The semiconductor device of claim 1, further comprising a first clock signal and a second clock signal that is a logical compliment of the first clock signal for facilitating the latching functionality of the switching circuit.

9. A semiconductor device, comprising:
   a switching circuit comprising a first portion and a second portion;
   a first supply voltage applied to the first portion of the switching circuit;
   a second supply voltage, different from the first supply voltage and applied to the second portion of the switching circuit;
   an input terminal coupled to the first portion of the switching, circuit and to the second portion of the switching circuit and configured to receive an input signal corresponding to the first supply voltage; and
   an output configured to output an output signal corresponding to the second supply voltage, wherein the switching, circuit provides latching functionality and level shifting functionality and a leakage path that is present when the switching circuit is providing level shifting functionality and is cut-off by a low threshold voltage transistor in the second portion controlled by a clock signal and a low threshold voltage transistor controlled by the input signal when the switching circuit is providing latching functionality.

10. The semiconductor device of claim 9, wherein the second supply voltage is larger than the first supply voltage.

11. The semiconductor device of claim 9, wherein the switching circuit comprises at least one transistor coupled to a ground and disabled during when the switching circuit is providing latching functionality.

12. The semiconductor device of claim 9, wherein the switching circuit comprises at least one transistor that decouples the input of the switching circuit from the output of the switching circuit during the latch phase so the input of the switching circuit does not alter the output of the switching circuit.

13. The semiconductor device of claim 9, further comprising a first clock signal and a second clock signal that is a logical compliment of the first clock signal for facilitating the latching functionality of the switching circuit.

14. A method for latching data in a level shifter, the method comprising:
providing a first supply voltage;
providing a second supply voltage, different from the first supply voltage;
providing a first clock signal;
providing a second clock signal, the second clock signal being a logical complement of the first clock signal;
providing a switching circuit comprising a first circuit configured to operate at the first supply voltage, and a second circuit configured to operate at the second supply voltage and receive the first clock signal, and the second clock signal;
providing an input terminal coupled to the first circuit and to the second circuit and configured to receive an input signal corresponding to the first supply voltage and supply the input signal as an input to the first circuit and the second circuit, and;
providing an output configured to output an output signal corresponding to the second supply voltage,
if the first clock signal is in a first logical state, latching the switching circuit to a transparent phase in which the switching circuit operates as a level shifter; and
if the first clock signal is in a second logical state, latching the switching circuit to a latch phase in which the switching circuit forms a latch and a leakage path for at least one MOS transistor operating at a second supply voltage is cut off by at least one low threshold voltage MOS transistor in the second circuit.

15. The method of claim 14, wherein the second supply voltage is larger than the first supply voltage.

16. The method of claim 14, wherein the switching circuit wherein the at least one transistor is coupled to a ground and is disabled as a result of the second clock signal applied to the gate of the at least one transistor when the switching circuit is providing latching functionality.

17. The method of claim 14, wherein the switching circuit comprises at least one transistor that de-couples the input of the switching circuit from the output of the switching circuit during the latch phase so the input of the switching circuit does not alter the output of the switching circuit.

18. The method of claim 14, wherein the level shifter is implemented within a dual-rail SRAM.

19. The method of claim 18, wherein an output of the level shifter is coupled to a memory cell with the dual-rail SRAM.

20. The method of claim 18, wherein if the first clock signal is in a second logical state, the switching circuit is in a latch phase in which the switching circuit forms a latch to write data into a memory cell of the dual-rail SRAM.

\* \* \* \* \*